United States Patent
Schwed et al.

(10) Patent No.: US 6,580,139 B1
(45) Date of Patent: Jun. 17, 2003

(54) MONOLITHICALLY INTEGRATED SENSING DEVICE AND METHOD OF MANUFACTURE

(75) Inventors: Stephen Schwed, Bridgewater, NJ (US); Edward W. Douglas, Randolph, NJ (US); Christopher Palmer, Glen Gardner, NJ (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 09/664,187

(22) Filed: Sep. 18, 2000

Related U.S. Application Data
(60) Provisional application No. 60/219,551, filed on Jul. 20, 2000.

(51) Int. Cl.[7] .............................................. H01L 29/76
(52) U.S. Cl. ...................................................... 257/421
(58) Field of Search .......................................... 257/421

(56) References Cited

U.S. PATENT DOCUMENTS

| | | | |
|---|---|---|---|
| 3,852,802 A | 12/1974 | Wolf et al. ..................... 357/27 |
| 4,843,444 A | 6/1989 | Partin et al. .................... 357/27 |
| 4,996,163 A | 2/1991 | Sasaki ............................. 437/5 |
| 4,999,692 A | 3/1991 | Ristic et al. .................... 357/27 |
| 5,049,522 A | 9/1991 | Stanchina et al. ............. 437/62 |
| 5,051,372 A | * 9/1991 | Sasaki |
| 5,077,231 A | 12/1991 | Plumton et al. ............... 437/51 |
| 5,170,228 A | * 12/1992 | Sasaki |
| 5,179,429 A | 1/1993 | Ristic .......................... 257/414 |
| 5,184,106 A | 2/1993 | Partin et al. ................... 338/32 |
| 5,213,987 A | 5/1993 | Bayraktaroglu .............. 437/24 |
| 5,242,839 A | * 9/1993 | Oh et al. |
| 5,268,315 A | 12/1993 | Prasad et al. ................. 437/31 |
| 5,298,453 A | 3/1994 | Hill ............................. 437/89 |
| 5,376,229 A | 12/1994 | Miller et al. ................ 156/651 |
| 5,385,864 A | 1/1995 | Kawasaki et al. .......... 437/132 |
| 5,422,501 A | 6/1995 | Bayraktaroglu ............ 257/195 |
| 5,438,952 A | 8/1995 | Otsuka ........................ 117/84 |
| 5,453,727 A | 9/1995 | Shibasaki et al. ............. 338/32 |
| 5,491,461 A | 2/1996 | Partin et al. ................... 338/32 |
| 5,621,227 A | 4/1997 | Joshi .......................... 257/184 |
| 5,674,778 A | 10/1997 | Lee et al. .................... 437/126 |
| 5,682,046 A | 10/1997 | Takahashi et al. .......... 257/198 |
| 5,856,209 A | 1/1999 | Imanishi ....................... 438/47 |
| 5,920,773 A | 7/1999 | Hafizi et al. ................ 438/170 |
| 5,953,617 A | 9/1999 | Lee ............................. 438/329 |
| 6,037,646 A | 3/2000 | Oki et al. .................... 257/471 |

FOREIGN PATENT DOCUMENTS

WO    WO 97/04493    2/1997

OTHER PUBLICATIONS

Hebner, G.A.; Biefeld, R.M.; Killeen, K.P. Metal Organic Chemical Vapor Deposition of InSb on GaAs and InSb in an Inverted Stagnation Point Flow Geometry; Advances in Materials, Processing and Devices in III–V Compound Semiconductors Symposium, Materials Research Society, Nov. 28–Dec. 2, 1988, Boston, MA.

Behet, M.; Das, J.; De Boeck, J.; Borghs, G. InAs/(Al,Ga)Sb Quantum Well Structures for Magnetic Sensors, IEEE Transactions on Magentics, vol. 34, No. 4, Jul. 1998, pp. 1300–1302.

Partin, D.L.; Heremans, J.; Thrush, C.M. Effect on an $In_{1-x}Al_xSb$ buffer layer on InSb thin film mobility, Journal of Vacuum Science and Technology, vol. 17, No. 3, May/Jun. 1999, pp. 1267–1271.

* cited by examiner

*Primary Examiner*—Stephen D. Meier
(74) *Attorney, Agent, or Firm*—Lerner, David, Littenberg, Krumholz & Mentlik, LLP

(57) ABSTRACT

A monolithically integrated, compound semiconductor sensing device and a method of making the device is provided. The device includes an signal conditioning circuit formed on a substrate surface. A sensor including one or more compound semiconductors is deposited on a second portion of the substrate surface. The signal conditioning circuit has a well formed therein for exposing the substrate surface and the sensor is deposited within the well.

19 Claims, 6 Drawing Sheets

MONOLITHICALLY INTEGRATED SENSING DEVICE AND METHOD OF MANUFACTURE

The present application claims benefit of U.S. Provisional Application Ser. No. 60/219,551 filed Jul. 20, 2000, the disclosure of which is hereby incorporated by reference herein.

FIELD OF THE INVENTION

The present invention relates to sensing devices. More particularly, the present invention relates to monolithically integrated, compound semiconductor sensing devices and methods of manufacturing such devices.

BACKGROUND OF THE INVENTION

Sensing devices are used in various applications, some of which subject these sensing devices to harsh operating conditions such as temperature extremes, dirty environments and electromagnetically active surroundings. For example, in the automobile industry sensing devices are used in crankshaft position detection, wheel speed sensors, brushless electric motors, and other environments subject to wide temperature variations. Automotive sensor specifications require sensors that continually operate with significant change in performance across temperatures ranging from −40° C. to over 200° C.

One conventional sensing device is a magnetic field sensing device. A magnetic field sensing device can be fabricated using a silicon semiconductor Hall sensor that is typically integrated into a silicon semiconductor signal conditioning circuit. A signal conditioning circuit is used to convert the output signal from the Hall sensor into a signal that is useful for its intended application.

Silicon Hall sensors possess the disadvantages of lower sensitivity and signal-to-noise ratio because of the low electron mobility of silicon. Accordingly, these silicon devices lack precision and require demanding signal conditioning circuitry. Additionally, traditional silicon circuitry is not suitable for use over a wide temperature range, particularly at temperatures greater than about 150° C. At higher temperatures, issues such as leakage current and parasitic conductance significantly impact the operation of silicon circuitry.

Sensing devices utilizing compound semiconductor technology are also available. Manufacture of these devices, however, involves separate fabrication of the integrated circuit components. In a standard manufacturing process, a magnetic field sensor, such as a Hall sensor, a magnetoresistor or a magnetotransistor, is fabricated by depositing at least one layer, usually multiple layers, of compound semiconductor material such as InSb on a substrate material. Typically, each of the layers used to form the magnetic field sensor has a different composition or contains a different dopant or dopant level than the adjacent layers. The materials used to form the layers in the manufacture of magnetic field sensors may be deposited as thin epitaxial films utilizing a process such as metal organic chemical vapor deposition (MOCVD), vapor phase epitaxy (VPE), liquid phase epitaxy (LPE) or molecular beam epitaxy (MBE). In a separate process, an application specific integrated circuit (ASIC) to provide signal conditioning is manufactured.

A prior art method for manufacturing a sensing device is shown in FIGS. 1A–1D. Referring to FIG. 1A, a substrate 10 having a top surface 12 may comprise a compound semiconductor material such as semi-insulating GaAs or other suitable III–V compound semiconductor material. Referring now to FIG. 1B, a sensor element 14 is shown on the surface 12 of the substrate 10. The sensor element may be any conventional sensor element, including a magnetic sensor, such as a Hall effect or magnetoresistive type sensor. Such a structure can be formed by one or more epitaxial layers. As shown in FIG. 1C, a separate substrate 20 is provided for manufacture of a signal conditioning circuit, which may be fabricated using either silicon or compound semiconductor technology.

FIG. 1D shows an example of signal conditioning circuit layers incorporating a heterojunction bipolar transistor (HBT) structure 22 deposited on substrate 20. As is known in the art, an HBT structure may include active layers such as an emitter layer 24, a base layer 26 and a collector layer 28. These layers may be etched or otherwise treated in conventional ways to form the elements of the signal conditioning circuit. Additional layers, such as dielectric layers and metallization layers (not shown), may be formed to provide contacts for interconnection with another device, and to interconnect elements of the signal conditioning circuit with one another. After separate fabrication of the magnetic sensor element and the signal conditioning circuit, the two structures are interconnected by wirebonding the structures together to form a completed sensing device.

Separate fabrication of the sensor and the signal conditioning circuit has several drawbacks. Wirebonding uses valuable space on both the sensor and signal conditioning circuit. Wirebonded devices tend to exhibit lower reliability than integrated devices that do not require wirebonding of the separate elements. In addition, the wire-bonding process is labor-intensive, costly and increases the size of the finished assembly.

It would be useful to provide a sensing device capable of operating over a wider temperature range than devices fabricated using silicon semiconductor signal conditioning circuits. It would also be advantageous to provide a process for manufacturing a compound semiconductor sensing device having a sensor and signal conditioning circuit that is less labor intensive, more reliable and less expensive than methods that involve separate device fabrication and interconnection.

SUMMARY OF INVENTION

Accordingly, one aspect of the present invention provides a monolithically integrated, compound semiconductor sensing device including a, signal conditioning circuit and a sensor element. In one embodiment, a sensor element including one or more compound semiconductors is epitaxially deposited over a first portion of the substrate surface. In another aspect of the invention, the semiconductor layers which will be used to form the signal conditioning circuit (the "signal conditioning epitaxy") is formed by epitaxial deposition of one or more compound semiconductors on second portion of the substrate surface.

In a preferred embodiment, the signal conditioning epitaxy include one or more III–V compound semiconductor. Similarly, the sensor element includes at least one III–V compound semiconductor, which typically is different from the compound semiconductor used in the signal conditioning epitaxy. Preferably, the surface of the substrate is formed from GaAs.

In a preferred embodiment, the sensor is a magnetic sensor, such as a Hall effect or magnetoresistive sensor. In one aspect of the invention, the sensor is in direct contact with the substrate surface. In another aspect of the invention, a buffer layer may be disposed between the substrate surface and the sensor. Similarly, a buffer layer may be disposed between the signal conditioning epitaxy and the substrate surface.

Another aspect of the invention involves a method of manufacturing a monolithic compound semiconductor sensing device. The method includes forming signal conditioning epitaxy adapted to form a signal conditioning circuit on a substrate surface and providing a well in the signal conditioning epitaxy to expose the substrate surface. In another aspect of the invention, a sensor is formed in the well structure.

In one embodiment of the invention, formation of the well structure within the signal conditioning circuit involves etching the well within the signal conditioning epitaxy after deposition of the signal conditioning epitaxy. According to a further embodiment of the invention, formation of the well within the signal conditioning circuit involves masking the substrate surface, depositing the signal conditioning epitaxy over the mask and removing the mask to provide a well.

In still another embodiment of a the invention, a method of manufacturing a monolithic compound semiconductor sensing device is provided which includes forming a sensor on a substrate surface and providing a well in the sensor to expose the substrate surface. A signal conditioning epitaxy is formed within the well formed in the sensor.

According to one embodiment of the invention, the step of providing a well in the sensor includes etching the well in the sensor. In a further embodiment of the invention, the step of providing a well in the sensor epitaxy includes masking the substrate surface, depositing the sensor over the mask and removing the mask to provide a well.

Preferably, the method of the present invention involves forming the signal conditioning epitaxy first, and then later epitaxially depositing the sensor in a well formed in the signal conditioning circuit. In general, the materials used to form sensor epitaxy, such as InSb, are not stable at the high temperatures required to form the signal conditioning epitaxy. Therefore, it is preferred that the signal conditioning epitaxy is formed first, and the sensor element is formed after deposition of the signal conditioning epitaxy.

The methods according to this aspect of the invention preferably further include the step of forming all or part of a signal conditioning circuit from the signal conditioning epitaxy. Most preferably, this step includes forming connections on the monolithic structure between the sensor element and the signal conditioning circuit.

Compared to devices using silicon sensors, the integrated devices of the present invention provide higher sensitivity, improved signal-to-noise ratio, greater robustness against electrostatic discharge, and substantially no switching noise. The present invention also has the advantage of greater flexibility in providing features to the magnetic field sensing device. This signal conditioning circuit can include essentially any elements which can be used in such a circuit, such as, for example, amplifiers, power supply components such as voltage regulators and overvoltage protection components such as zener diodes. Monolithically integrating the sensor and the signal conditioning circuit in one die provides several other advantages.

The monolithically integrated manufacturing method of the present invention provides a simpler and less expensive method of manufacturing sensing devices which utilize a sensor and a signal conditioning circuit than conventional processes involving separate fabrication of the components. For example, the pick-and-place portion of the device assembly operation is simplified since only one die incorporating both components requires handling. The wire-bonding of the signal conditioning and sensor components is less expensive, due to the fact that only the input and output connections of the components need to be wired. In the conventional process, in which the components are separately fabricated, die-to-die interconnections also need to be separately wire-bonded.

It will be understood that fewer manufacturing steps provides an opportunity for improved product yields and reduced manufacturing errors. In addition, device reliability is improved due to the fact that the finished device has fewer interconnections. Additional features and advantages of the invention will be set forth in the following detailed description. It is to be understood that both the foregoing general description and the following detailed description are exemplary and are intended to provide further explanation of the invention as claimed.

DETAILED DESCRIPTION OF THE PREFERRED EMBODIMENTS

Figure 1A:
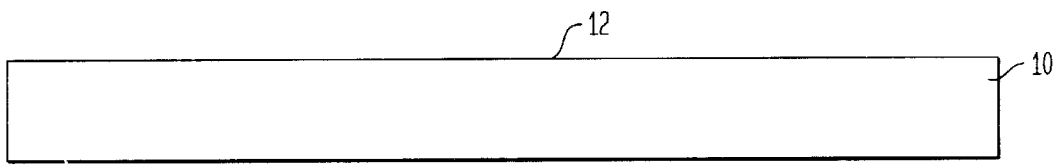
FIGS. 1A–1D show a cross-sectional view of prior art method of making a sensing device.
Figure 1B:
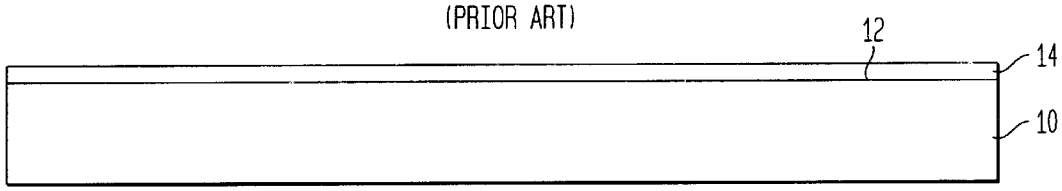
Figure 1C:
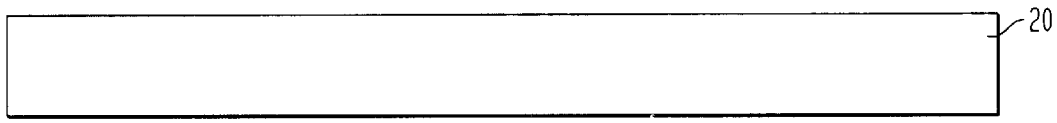
Figure 1D:
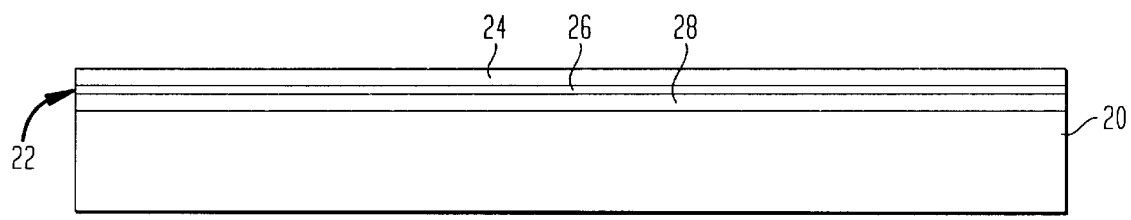
Figure 2:
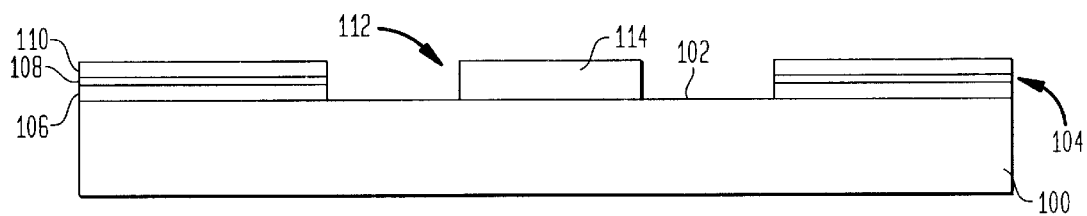
FIG. 2 shows a cross-sectional view of an embodiment of a device according to the present invention.

Reference will now be made in detail to the present preferred embodiment of the invention, an example of which is illustrated in the accompanying drawings. FIG. 2 shows a substrate 100, which is preferably a semi-insulating compound semiconductor material such as GaAs. Substrate 100 has a substrate surface 102. In a preferred embodiment, signal conditioning epitaxy 104 adapted to form a signal conditioning circuit are epitaxially deposited on the substrate surface. Preferably, the signal conditioning epitaxy includes bipolar transistor structure, such as a heterojunction bipolar transistor (HBT), which is well-known in the art. For example, an HBT structure includes at least a collector layer 106, a base layer 108, and an emitter layer 110, as is known in the art. It will be appreciated that the HBT structure can include additional layers such as a subcollector and other layers, depending on the requirements of the particular device.

According to one aspect of the invention, a well structure 112 can be formed in the signal conditioning epitaxy 104, and preferably the well structure exposes the substrate surface 102. Sensor epitaxy 114 is formed in the well structure 112. Preferably, the sensor epitaxy 114 is adapted to form a magnetic sensor such as a Hall sensor or a magnetoresistive sensor, which are known in the art. For example, the sensor epitaxy 114 may include at least one InSb layer. However, the invention is not limited to any particular material, and other sensor materials such as GaAS, InAs and HgCdTe could be utilized to form the sensor.

Figure 3:
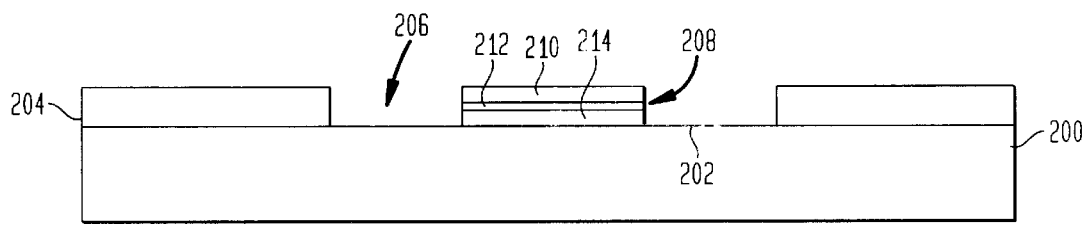
FIG. 3 shows a cross-sectional view of an alternative embodiment of a device according to the present invention.

In another embodiment shown in FIG. 3, a substrate 200 having a surface 202 is provided. The substrate 200 is preferably a semi-insulating material such as GaAs or other suitable III–V compound semiconductor material. A sensor epitaxy 204 is formed on the substrate surface. Preferably, the sensor epitaxy 204 is adapted to form a magnetic sensor such as a Hall effect sensor or magnetoresistive sensor. In a preferred embodiment, the sensor is formed from a material such as InSb or InAs. The sensor epitaxy 204 includes a well structure 206 formed therein, and the well structure 206 preferably exposes the surface 202 of the substrate 200. A signal conditioning epitaxy 208 is deposited within the well structure 206. Preferably the signal conditioning epitaxy includes a bipolar transistor structure including at least a collector layer 214, a base layer 212, and an emitter layer 210.

Figure 4A:
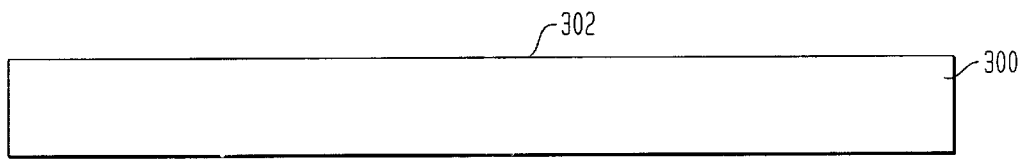
FIGS. 4A–4I show a cross-sectional view of an alternative method of making a device in accordance with an embodiment of the present invention.
Figure 4B:
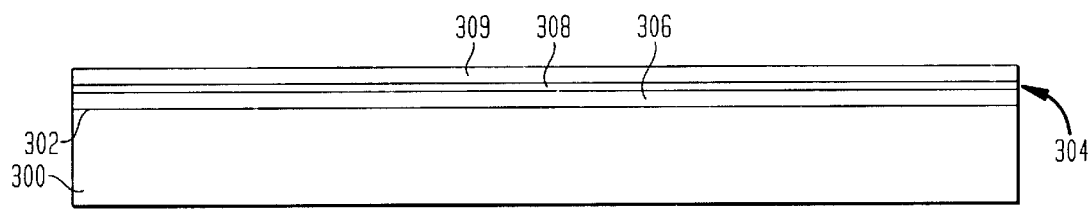

Referring now to FIGS. 4A–4I, a further method of manufacturing a compound semiconductor sensing device is shown. As shown in FIG. 4A, a substrate 300 having a surface 302 is provided. The substrate 300 is preferably a semi-insulating compound semiconductor material such as GaAs. Referring to FIG. 4B, a signal conditioning epitaxy 304 is deposited on the substrate surface 302. As shown in FIG. 4B, preferably the signal conditioning epitaxy includes a bipolar transistor structure having a collector layer 306, a base layer 308 and an emitter layer 309.

Figure 4C:
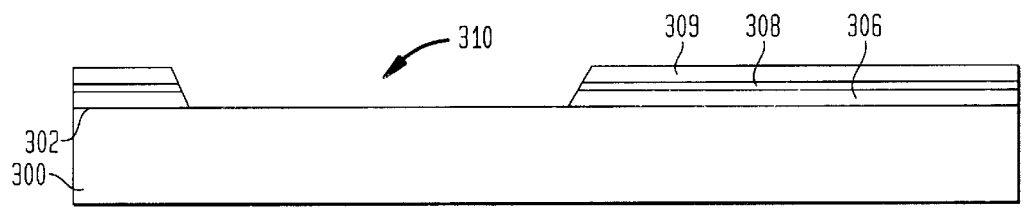

Referring now to FIG. 4C, a well structure 310 is provided in the signal conditioning epitaxy 304. The well structure 310 can be formed by a variety of methods known in the art. For example, the well structure 310 can be formed by first depositing the signal conditioning epitaxy 304 and then etching the well structure 310 in the signal conditioning epitaxy 304 by methods known in the art. Alternatively, the well structure 310 can be provided in the signal conditioning epitaxy 304 by masking the substrate surface 302 according to methods known in the art. After masking the substrate surface 302, the signal conditioning epitaxy 304 can be deposited. The mask is then removed to provide the well structure 310 in the signal conditioning epitaxy 304. Preferably, the well structure 310 exposes the substrate surface 302.

Figure 4D:
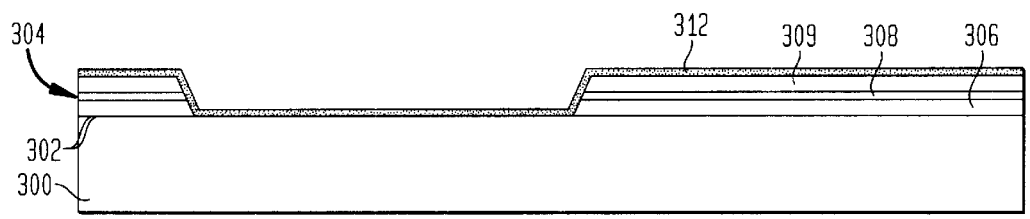

Referring now to FIG. 4D, sensor epitaxy 312 is provided in the well structure 310. Preferably the sensor epitaxy 312 includes at least one epitaxial layer of InSb or InAs adapted to form a magnetic sensor such as a Hall effect sensor or magnetoresistive sensor. As shown in FIG. 4D, the sensor epitaxy may be deposited in the well structure 310 and over the signal conditioning epitaxial structure 304. Those portions of the sensor epitaxy overlying the signal conditioning structure 304 are then removed as, for example, by etching. Alternatively, the signal conditioning epitaxial structure 304 can be selectively masked prior to deposition of the sensor epitaxy according to methods known in the art, and the sensor epitaxy 312 can be deposited only in the well-structure 310.

Figure 4E:
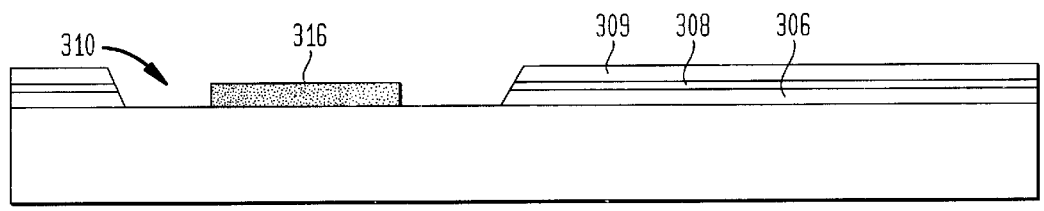
Figure 4F:
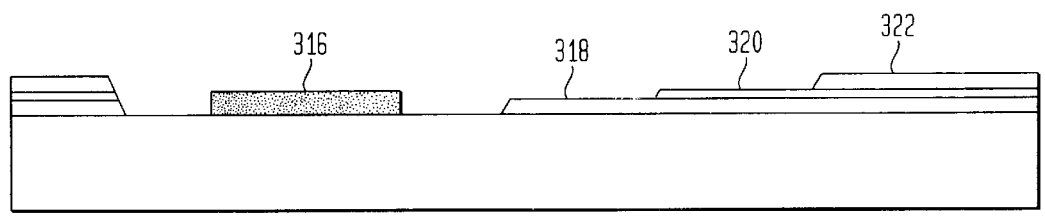

After formation of the signal conditioning structure, the well structure 310 and the sensor epitaxy 312 within the well structure 310, further processing steps known in the art may be performed to fabricate the sensing device and to form the signal conditioning circuit from the signal conditioning epitaxy. For example, photolithographic techniques known in the art can be used to form a sensor mesa 316 as shown in FIG. 4E. Referring to FIG. 4F, further photolithographic processing can be used to etch mesas 318, 320 and 322 in the signal conditioning epitaxy 304.

Figure 4G:
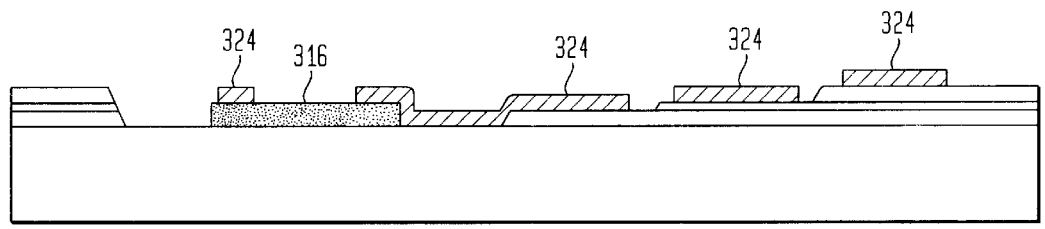
Figure 4H:
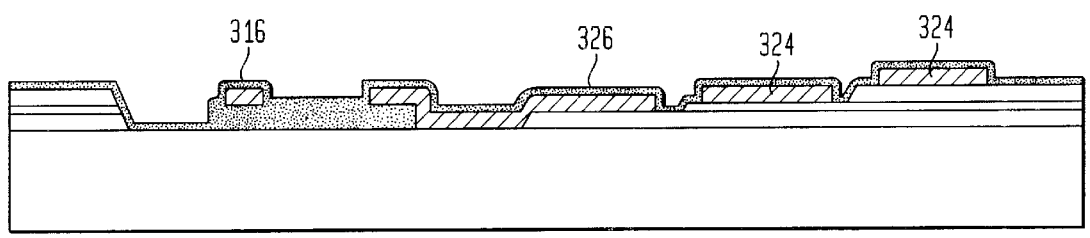
Figure 4I:
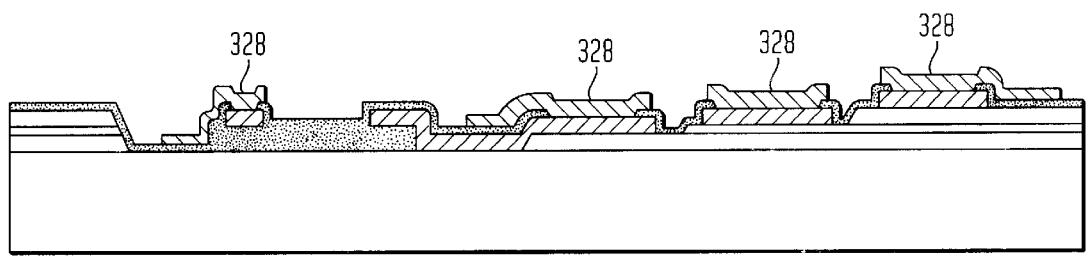

As shown in FIGS. 4G and 4H, metal contacts and interconnects 324 and dielectric layers 326 can be formed by techniques known in the art. The interconnects 324 include one or more interconnects extending between the sensor elements and elements and one or more elements of the signal conditioning circuit, and may also include one or more interconnects extending between elements of the signal conditioning circuit itself. As shown in FIG. 4I, additional metal contacts 328 can be deposited over the dielectric layer. In use of the device the contacts provide connections between the signal conditioning circuit and external devices. Further processing steps known in the art of forming integrated circuits can be performed to fabricate a device in accordance with the present invention.

Figure 5A:
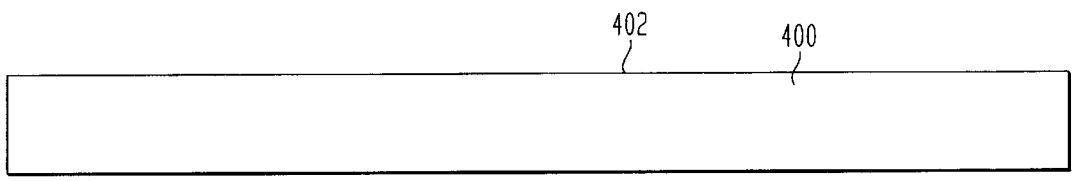
FIGS. 5A–5D show a cross-sectional view of alternative method of making a device in accordance with the present invention.
Figure 5B:
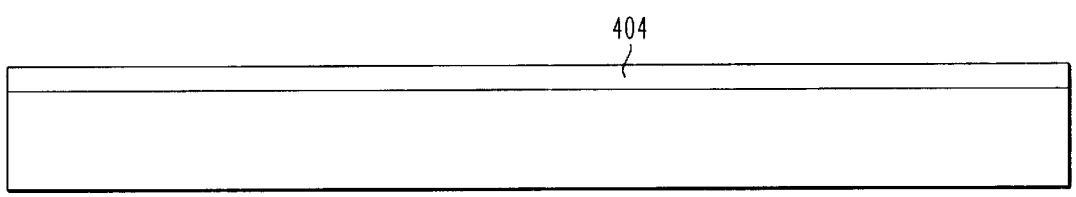
Figure 5C:
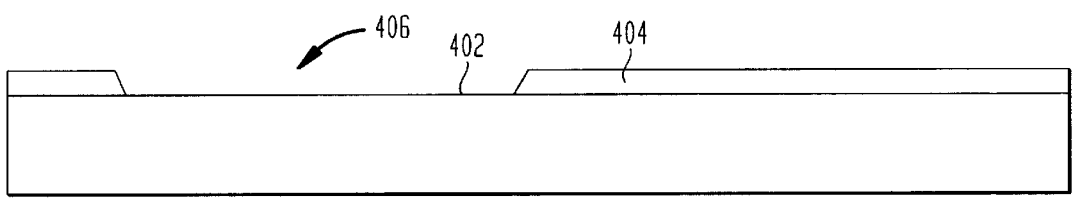

In another embodiment of the invention shown in FIGS. 5A–5D, a method of making a sensing device is shown. FIG. 5A shows a substrate 400 having a surface 402. Preferably, the substrate 400 is a semi-insulating material such as GaAs or another suitable III–V compound material. FIG. 5B shows a sensor epitaxy 404 deposited on the substrate surface. As in the previous embodiments, preferably the sensor epitaxy forms a magnetic sensor, such as a Hall effect or magnetoresistive sensor. A well 406 is provided in the sensor epitaxy, and preferably the well 406 exposes the substrate surface 402, as shown in FIG. 5C.

As in the previously described embodiment, the well 406 can be provided by methods known in the art. For example, the well 406 can be provided by etching a well in the sensor epitaxy 404 after deposition of the sensor epitaxy 404. Alternatively, the well can be provided by selectively masking the substrate surface 402 prior to deposition of the signal processing epitaxy 404 and removing the masking to provide the well 406 in the sensor epitaxy.

Figure 5D:
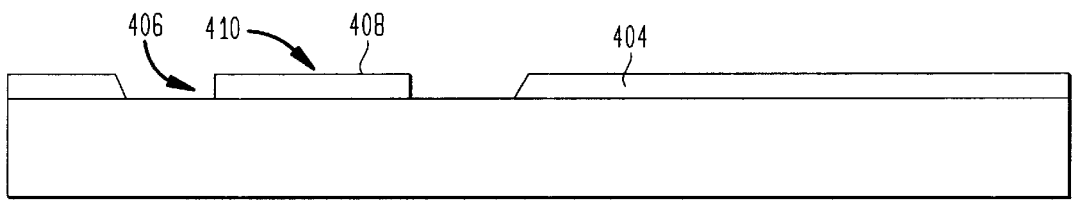

Referring to FIG. 5D, a signal conditioning epitaxy 408 is deposited in the well 406. The signal conditioning epitaxy 408 can be deposited in the well 406 and over the sensor epitaxy 404, and the signal conditioning epitaxy can be selectively etched to provide a signal conditioning circuit mesa 410 within the well 406, as shown in FIG. 5D. Alternatively, the sensor epitaxy 404 can be selectively masked to leave the well open prior to deposition of the sensor epitaxy so that the signal conditioning epitaxy 408 is deposited only in the well. Such masking would provide a signal conditioning circuit mesa 410 in the well.

As in the previous embodiment described in FIGS. 4A–4I, additional processing steps known in the art of integrated circuit processing may be performed to provide a finished sensing device. For example, photolithographic steps can be performed to form mesas in the sensor element, and metal contacts, and dielectric layers can be provided to interconnect the sensor and the signal conditioning circuit. A buffer layer can be provided between the substrate surface and the sensor and/or between the substrate and the signal conditioning circuit.

It will be appreciated that it may be preferable to first deposit the signal conditioning circuit prior to deposition of the sensor element. This is so because certain materials for forming magnetic sensors, such as InSb, are not stable at the higher temperatures required to process the materials used to form the signal conditioning circuit. However, InAs or other materials can be used in formation of the sensor element, which would possibly accommodate higher temperature processing required to deposit an signal conditioning circuit.

One example of the epitaxial layers making up a bipolar transistor structure is provided in Table I. Of course, the layers could be formed using heterojunctions of different III–V materials, such as AlGaAs and InGaP.

TABLE 1

| Layer | Material | Thickness Range | Dopant Concentration ($cm^{-3}$) |
|---|---|---|---|
| Emitter | n-GaAs | 0.2–0.5 micron | $1 \times 10^{17}$ to $5 \times 10^{18}$ |
| Base | p-GaAS | 0.04–0.15 micron | $>1 \times 10^{19}$ |
| Collector | n-GaAs | 0.3–2.0 micron | $<1 \times 10^{18}$ |

The sensor epitaxy is preferably formed from at least one layer of InSb or InAs having a thickness of about 0.4 microns to about 1.6 microns. Preferably, the sensor material has a mobility of about 35,000 $cm^2$/V-s or greater.

It will be apparent to those skilled in the art that various modifications and variations can be made to the device and method of the present invention without departing from the spirit or scope of the invention. For example, the materials, dopants, dopant concentrations, and thickness of the layers making up the various bipolar transistor, buffer and sensor elements can be varied to achieve the desired device properties. Also, it not essential to deposit the various layers of the signal conditioning epitaxy as uniform layers. For example, mesa structures can be formed by selectively depositing one or more of the layers in the signal conditioning epitaxy over only a part of another layer in the signal conditioning epitaxy. Similarly, the processing conditions for fabricating the devices of the present invention, such as temperature, can be varied. Thus, it is intended that the present invention cover the modifications and variations of this invention provided they come within the scope of the appended claims and their equivalents.

What is claimed is:

1. A monolithically integrated compound semiconductor sensing device comprising:
    (a) a substrate having a surface;
    (b) a sensor including one or more compound semiconductors epitaxially deposited over a first portion of said surface of said substrate; and
    (c) a signal conditioning circuit including one or more compound semiconductors epitaxially deposited over a second portion of said surface of said substrate, wherein said signal conditioning circuit has a well formed therein for exposing the substrate surface and said sensor is deposited within the well.

2. A device as claimed in claim 1, wherein said one or more compound semiconductors of said signal conditioning circuit includes one or more III–V compound semiconductors and said one or more compound semiconductors of said sensor include one or more III–V compound semiconductors.

3. A device as claimed in claim 2, wherein said surface of said substrate is formed from a III–V compound semiconductor.

4. A device as claimed in claim 3, wherein said surface of said substrate is formed from GaAs.

5. A device as claimed in claim 4, wherein said one or more III–V compound semiconductors of said sensor is selected from the group consisting of GaAs, InSb, InAs and HgCdTe.

6. A device as claimed in claim 5, wherein said sensor is in direct contact with said GaAs.

7. A device as claimed in claim 6, wherein said one or more compound semiconductors of said signal conditioning circuit include GaAs.

8. A device as claimed in claim 2, wherein a buffer layer is disposed between the substrate surface and said sensor and between said substrate surface and said signal conditioning circuit.

9. A monolithically integrated compound semiconductor sensing device comprising:
    (a) a substrate having a surface;
    (b) a magnetic sensor including one or more compound semiconductors epitaxially deposited over a first portion of said surface of said substrate; and
    (c) a signal conditioning circuit including one or more compound semiconductors epitaxially deposited over a second portion of said surface of said substrate.

10. A device as claimed in claim 9, wherein said magnetic sensor is a Hall sensor.

11. A device as claimed in claim 9, wherein said magnetic sensor is a magnetoresistive sensor.

12. A device as claimed in claim 9, wherein said signal conditioning circuit has a well formed therein for exposing the substrate surface and said magnetic sensor is deposited within the well.

13. A device as claimed in claim 9, wherein said one or more compound semiconductors of said signal conditioning circuit includes one or more III–V compound semiconductors and said one or more compound semiconductors of said magnetic sensor include one or more III–V compound semiconductors.

14. A device as claimed in claim 13, wherein said surface of said substrate is formed from a III–V compound semiconductor.

15. A device as claimed in claim 14, wherein said surface of said substrate is formed from GaAs.

16. A device as claimed in claim 15, wherein said one or more III–V compound semiconductors of said magnetic sensor is selected from the group consisting of GaAs, InSb, InAs and HgCdTe.

17. A device as claimed in claim 16, wherein said magnetic sensor is in direct contact with said GaAs.

18. A device as claimed in claim 17, wherein said one or more compound semiconductors of said signal conditioning circuit include GaAs.

19. A device as claimed in claim 13, wherein a buffer layer is disposed between the substrate surface and said magnetic sensor and between said substrate surface and said signal conditioning circuit.

* * * * *